(12) United States Patent
Pawlak

(10) Patent No.: US 8,357,595 B2
(45) Date of Patent: Jan. 22, 2013

(54) SEMICONDUCTOR SUBSTRATE WITH SOLID PHASE EPITAXIAL REGROWTH WITH REDUCED DEPTH OF DOPING PROFILE AND METHOD OF PRODUCING SAME

(75) Inventor: Bartlomiej J. Pawlak, Heverlee (BE)

(73) Assignee: IMEC, Leuven (BE)

( * ) Notice: Subject to any disclaimer, the term of this patent is extended or adjusted under 35 U.S.C. 154(b) by 1241 days.

(21) Appl. No.: 10/596,603

(22) PCT Filed: Dec. 10, 2004

(86) PCT No.: PCT/IB2004/052753
§ 371 (c)(1),
(2), (4) Date: Apr. 24, 2009

(87) PCT Pub. No.: WO2005/064662
PCT Pub. Date: Jul. 14, 2005

(65) Prior Publication Data
US 2009/0256146 A1  Oct. 15, 2009

(30) Foreign Application Priority Data

Dec. 22, 2003 (EP) .................................. 03104871

(51) Int. Cl.
*H01L 21/20* (2006.01)
(52) U.S. Cl. .............................. 438/486; 257/E21.133
(58) Field of Classification Search .................. 438/486; 257/75, E21.133
See application file for complete search history.

(56) References Cited

U.S. PATENT DOCUMENTS

2002/0142553 A1* 10/2002 Jenq ............................. 438/301

* cited by examiner

*Primary Examiner* — Lex Malsawma
(74) *Attorney, Agent, or Firm* — Knobbe, Martens, Olson & Bear LLP

(57) ABSTRACT

Method of producing a semiconductor device, comprising: a) providing a semiconductor substrate, b) providing an insulating layer on a top surface of the semiconductor substrate, c) making an amorphous layer in a top layer of said semiconductor substrate by a suitable implant, d) implanting a dopant into said semiconductor substrate through said insulating layer to provide said amorphous layer with a predetermined doping profile, said implant being performed such that said doping profile has a peak value located within said insulating layer, e) applying a solid phase epitaxial regrowth action to regrow said amorphous layer and activate said dopant.

7 Claims, 3 Drawing Sheets

SEMICONDUCTOR SUBSTRATE WITH SOLID PHASE EPITAXIAL REGROWTH WITH REDUCED DEPTH OF DOPING PROFILE AND METHOD OF PRODUCING SAME

The present invention relates to a method of producing a semiconductor device comprising:
a) providing a semiconductor substrate,
b) providing an insulating layer on a top surface of the semiconductor substrate,
c) making an amorphous layer in a top layer of the semiconductor substrate by a suitable implant,
d) implanting a dopant into the semiconductor substrate through said insulating layer to provide the amorphous layer with a predetermined doping profile,
e) applying a solid phase epitaxial regrowth action to regrow the amorphous layer and activate the dopant.

Such a method is known from U.S. Pat. No. 6,063,682. According to this prior art document, heavy ions are implanted into a silicon substrate. The implanted heavy ions create an amorphous layer at the top surface of the substrate. The amorphous layer is free of channels. Then, a silicon implanting step is performed to create an excess of vacancies compared to interstitials within a top layer of the substrate. Since the amorphized silicon layer is free of channels, the depth of implant is mainly restricted to this amorphized silicon layer.

In the implanting step, e.g., boron (B) is used in a dose within a range of $10^{13}$ to $10^{15}$ cm$^2$ at an energy level of less than 15 keV. As shown in the Figures of this prior art document, the boron implant has a peak value at a substantial distance from the top surface of the silicon substrate. As will be shown in detail below, this results in a poor conductivity profile at the top layer, approximately at a distance up to 10 nm from the top surface, within the silicon substrate.

It is an object of the present invention to provide a method of producing a semiconductor device as stated at the outset that results in a better conductivity profile at the top layer of the device.

To this end, the present invention provides a method as defined above wherein, in action d), the implant is performed such that the doping profile has a peak value located within the insulating layer.

By performing this latter action, the top layer of the silicon substrate forms a junction with an improved sheet resistance and significantly reduced junction depth. A practical junction depth reduction is expected to be up to 30%.

In an embodiment, the dopant is activated to provide the amorphous layer after action e) with a conductivity profile having a peak conductivity value located substantially at the top surface.

The amorphous layer may be made in a Si semiconductor substrate by means of at least one of Ge, GeF$_2$, Si, Xe or Ar atoms. If Ge atoms are used, a dose of $10^{15}$ atoms/cm$^2$ and an energy between 2 and 30 keV may be applied.

The present invention also relates to a semiconductor device made by a solid phase epitaxial regrowth technique, comprising a top layer at a surface of a semiconductor substrate with a conductivity profile having a peak conductivity value substantially at the surface.

In another embodiment the invention relates to a metal oxide semiconductor device comprising such a device.

Moreover, the invention relates to an apparatus provided with such a semiconductor device or such a metal oxide semiconductor device.

Now, the present invention will be illustrated with reference to some drawings, which are intended only to illustrate the present invention and not to limit its scope. The scope is limited only by the definition of the claims as annexed to this description, and its technical equivalents.

In the description to follow, same reference numbers refer to same elements in all Figures. FIGS. 1a-1f refer to producing a metal oxide semiconductor device in which the present invention is used. However, as will be evident to a person skilled in the art, the inventive features may be applied in the production of any other type of semiconductor device where shallow junctions are desired.

Figure 1A:
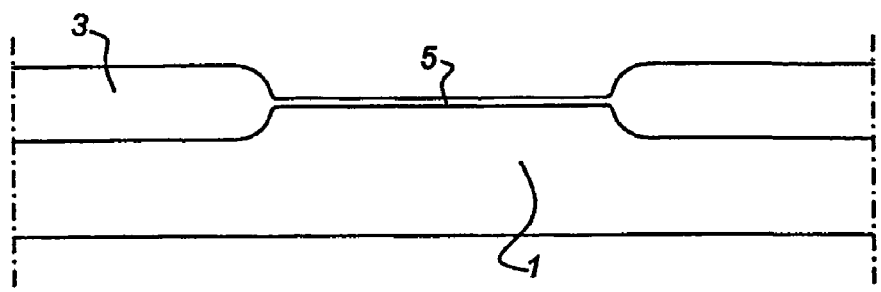
FIGS. 1a-1f show different stages of producing a semiconductor device in accordance with the present invention.
Figure 1B:
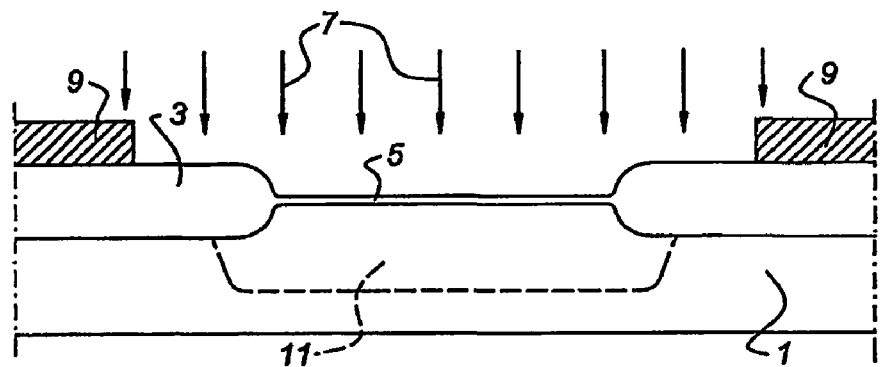

FIG. 1a shows a semiconductor substrate 1 of a p-type. Field oxide regions 3 are provided on a top surface of the semiconductor substrate 1. At certain locations, a thin oxide layer 5 is provided by a technique known to a person skilled in the art. The thin oxide layer 5 can later be used as the gate oxide layer within the MOS device to be produced. However, the present invention is not restricted to the application of a thin oxide layer 5 to obtain the desired effect as will become clear from the description below.

The structure of FIG. 1a is provided with a suitable photoresist layer 30 having an opening above the thin oxide layer 5. Next, an implanting action is performed to produce an n-well 11 within the substrate 1.

Figure 1C:
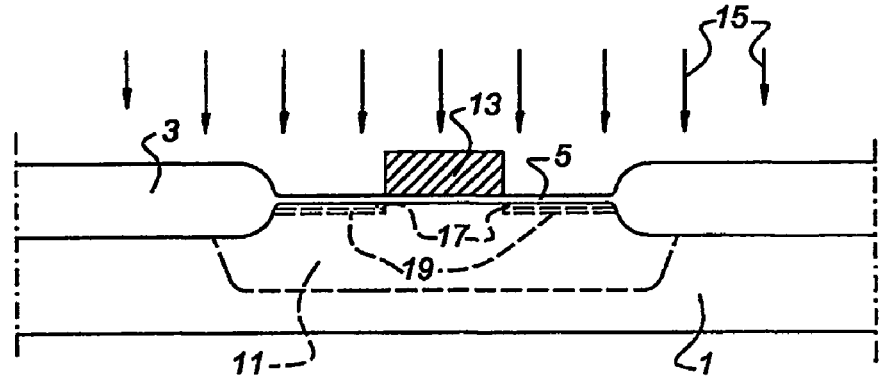

The thin oxide layer 5 may be removed and substituted by a new, fresh oxide layer, and is used later on as the gate oxide layer in the MOS device to be produced. However, here it is assumed that the thin oxide layer 5 remains in place. As shown in FIG. 1c, on top of the thin oxide layer 5, a polysilicon layer 13 is provided, which is to be used later as the gate of the MOS device to be produced.

An amorphization implant 15 is performed to produce an amorphous layer in the top of the substrate 1. The depth of the implant that defines the depth of the amorphous layer is indicated by means of reference number 17. The implant 15 to produce this amorphous layer may be performed using Ge, GeF$_2$ or Si. However, other atoms, like xenon, argon or indium, may be applied instead. By this implant, the channels in the silicon substrate 1 are eliminated in the amorphous layer.

This step of producing the amorphous layer is followed by a subsequent dopant implant, e.g., with boron. Since there are no channels within the amorphous layer, the dopant implant atoms, like boron, will penetrate the silicon substrate 1 to a depth only slightly below the amorphous layer. The depth of this subsequent dopant implant is indicated by means of reference number 19. It is to be understood that the depth of implant 19 is only slightly larger than the depth of the amorphous layer 17. The distances between the dashed line 17 and the top surface and the distance between the dashed line 19 and the top surface of substrate 1 are not drawn to scale. They are drawn only to illustrate the principle of the present invention.

Figure 2:
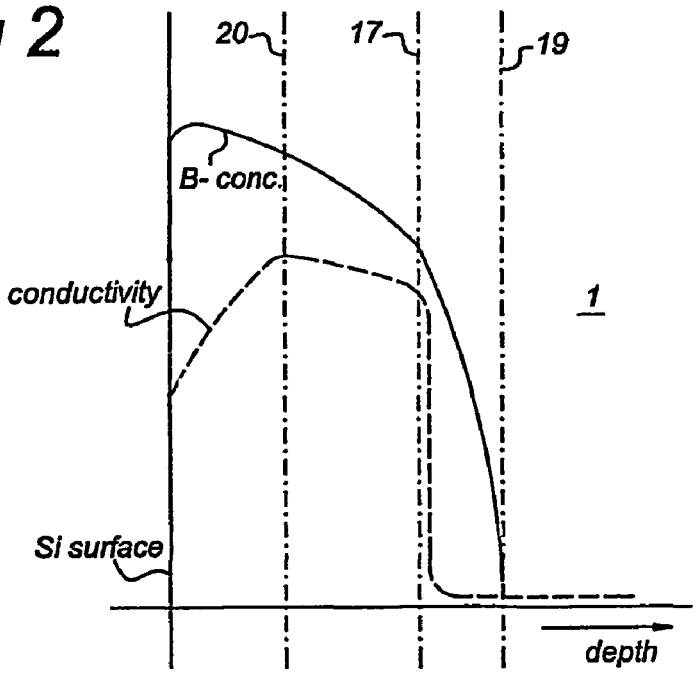
FIG. 2 shows an example of a dopant concentration and a conductivity profile as a function of depth in a semiconductor substrate in accordance with a method known from the prior art.

Now, reference is made to FIG. 2.

FIG. 2 shows the top of the silicon substrate, the depth of the amorphous layer 17 and the depth of the implant of boron (as an example) 19. The boron profile corresponds to the boron profile as shown in prior art document U.S. Pat. No. 6,063,682.

A next action is to apply a so-called low temperature approach, i.e. a solid phase epitaxial regrowth (SPER) technique. In SPER, the silicon crystal is first pre-amorphized, then doped and finally regrown at a temperature typically between 550° C. and 750° C. By this temperature action, the amorphous layer is regrown and the dopant (e.g., boron) is activated. The main advantages of SPER are limited dopant diffusion (hardly beyond the amorphous layer 17) and above solid solubility dopant activation.

Experiments by the present inventor have shown that for a boron profile as indicated in FIG. 2, after the temperature activation, a conductivity profile as indicated in FIG. 2 results. That is, the conductivity within a top layer that corresponds to the earlier amorphous layer 17, rises with increasing depth from the semiconductor substrate surface to a peak value at a certain distance indicated by means of a dashed line 20 in FIG. 2. At a depth beyond that indicated by means of the dashed line 20, the conductivity falls. Behind the dashed line 17, which corresponds to the earlier depth of the amorphous layer, the conductivity falls dramatically since there are hardly any activated dopant atoms.

The distance between the dashed line 20 and the semiconductor substrate surface may be between 2-7 nm. Thus, the conductivity of the uppermost top layer is not ideal. It is believed that this is due to poor boron activation caused by too high a boron concentration in this uppermost top layer of the substrate.

Figure 3:
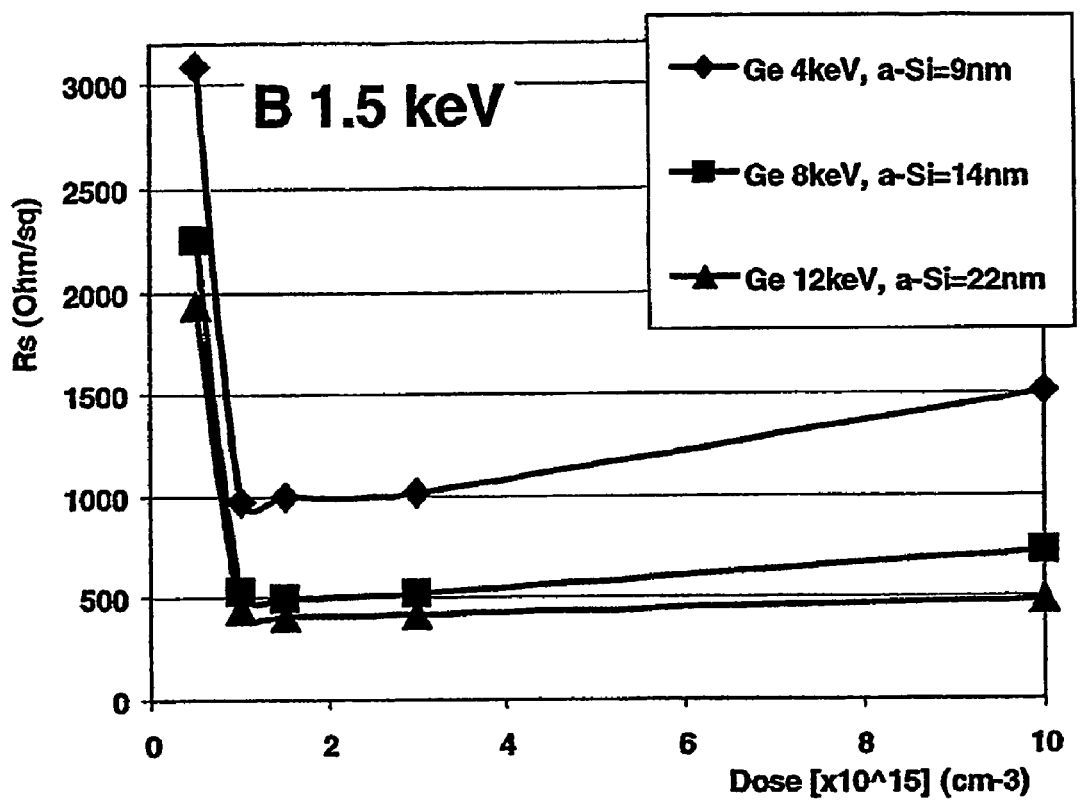
FIG. 3 shows an Rs-sheet resistance for some p-type junctions with three different original amorphous depths within a semiconductor device, as obtained with a method known from the prior art.

FIG. 3 shows some results of other experiments to further illustrate the reduced conductivity in the uppermost top layer of the semiconductor substrate.

FIG. 3 shows the dependence of Rs-sheet resistance for a p-type junction with three different original amorphous depths: i.e., 9, 14 and 22 nm, respectively, versus boron implant doses of: $5.10^{14}$, $10^{15}$, $1.5.10^{15}$, $3.10^{15}$, and $10^{16}$ ions/cm$^2$ at an identical implant energy of 1.5 keV, respectively. The depths of 9, 14 and 22 nm, respectively, are the junction depths. As shown, a dose of $5.10^{14}$ ions/cm$^2$ is too low to offer a decent amount of dopants for junction activation. An increment of the dose up to $10^{15}$ ions/cm$^2$ supplies enough dopants for maximum junction activation. An additional increment of the dose up to $3.10^{15}$ ions/cm$^2$ does not substantially affect the sheet resistance value. However, incrementing the dose further up to, e.g., $1.10^{16}$ ions/cm$^2$ reduces the boron activation within the junction, as can be seen by a higher sheet resistance value. Apparently, a dopant dose above a certain level reduces the performance of the junction.

Figure 4:
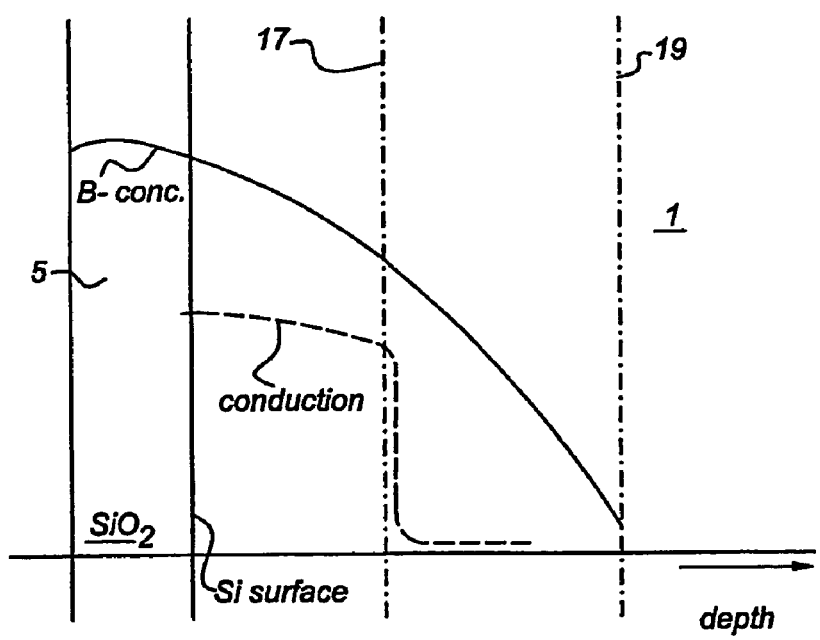
FIG. 4 shows similar profiles as FIG. 2, however, the profiles of FIG. 4 are obtained using the method of the present invention.

To solve this problem, the present invention proposes to provide a different dopant profile, as will be illustrated with reference to FIG. 4. On top of the semiconductor substrate there will be a thin oxide layer 5 (or any other suitable insulating layer). This thin oxide layer 5, that may have a thickness of 2-4 nm, is used together with a suitable dose and energy of the dopant, e.g., boron, to produce a dopant profile such that the peak of the dopant profile is located within the oxide layer 5. Preferably, the highest value of the dopant concentration within the semiconductor device, at the semiconductor device surface, is selected such that the maximum obtainable conduction by these dopants is located substantially at the semiconductor substrate surface, as shown in FIG. 4. As a result, within, the semiconductor substrate 1 there is no uppermost top layer with a reduced sheet resistance.

In order to obtain the dopant profile as indicated in FIG. 4, in an example, boron may be used with a relatively low energy, i.e. less than 5 keV, more preferably lower than 1.5 keV, at a standard dose of the order of $10^{15}$ ions/cm$^2$. The activation of the junction and an optional silicide formation (not explained in detail here since it is not relevant to the present invention) during the SPER process takes place at a temperature typically between 550 and 700° C. during a period of typically ±1 minute. The thickness of the resulting conduction layer, i.e. between the Si surface and line 17, may be 7-12 nm.

By applying the inventive method, the junction as produced will have almost the same conductivity over its entire depth, which is significantly reduced. It is expected that the junction depth may be reduced by up to 30% in comparison with prior art methods.

Moreover, a junction with a box-like junction profile will result. The activation of dopants is within the original amorphous semiconductor layer and the top part of the junction will not suffer from too high a dopant concentration.

Moreover, in some applications the process flow may be simplified by the present method. That is to say, in typical prior art processes insulating layers on top of the semiconductor substrate are removed before dopant implantation. Here, however, if such an insulating layer already exists on top of the substrate, it is intentionally used in the process.

The proposed junction formation can be used for p-type junctions, i.e., e.g. by using boron. However, the invention can equally well be applied for n-type junctions. Moreover, the inventive solution can be applied for both n- and p-nodes simultaneously.

Now, with reference to FIGS. 1d-1f, the completion of the semiconductor device to be produced will be explained.

Figure 1D:
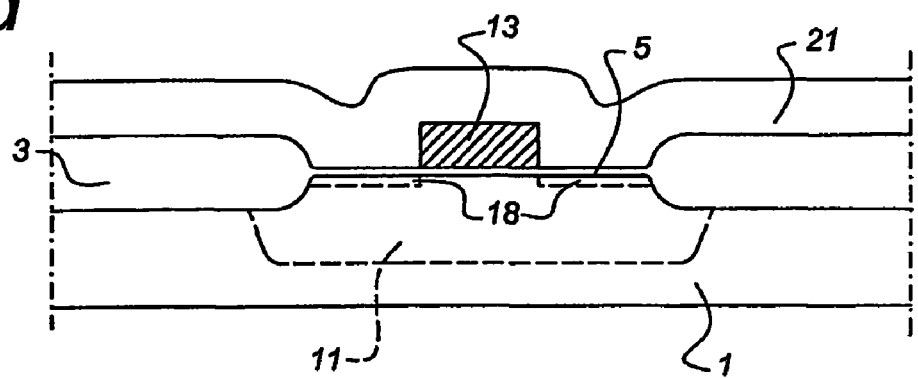
Figure 1E:
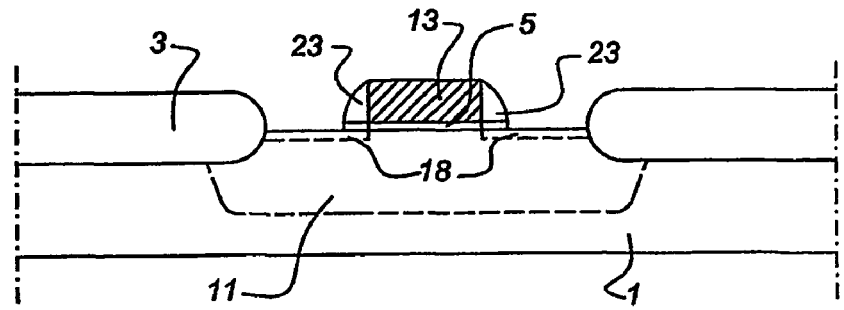

As shown in FIG. 1d, after the SPER process, lightly doped regions 18 result that will become source/drain extension regions of the MOS transistor on the substrate 1. The depth of these doped regions 18 will be substantionally equal to the depth of the earlier amorphous layer 17.

On top of the structure, a spacer material 21 is deposited. The spacer material 21 may be silicon dioxide. However, other spacer materials may be used, as is known to a, person skilled in the art.

The spacer material 21 is etched with a suitable etchant in such a manner that only side spacers 23 adjacent to the polisilicon layer 13 remain. See FIG. 1e. This is all prior art and needs no further explanation here. It is noted that, due to the etch process, only a portion of the thin oxide layer 5 remains, i.e. the portion below the polysilicon layer 13 and the portions below the side spacers 23. The portions of the thin oxide layer 5 that are situated elsewhere are removed by the etch process.

Figure 1F:
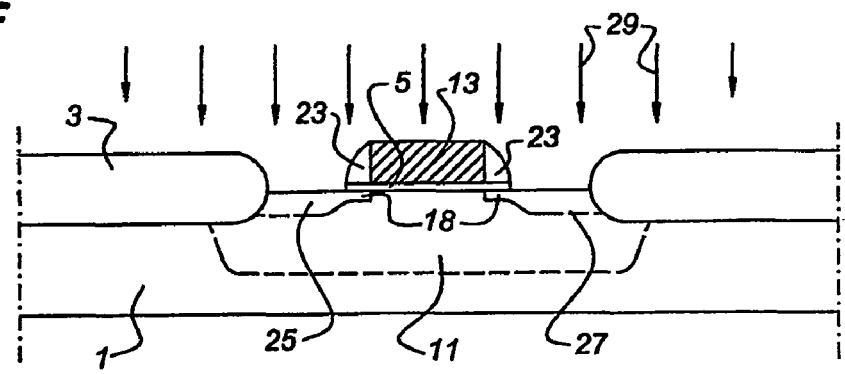

A further ion implant action is performed as shown in FIG. 1f. In the embodiment shown, this is a p$^+$ implant 29 to produce a p$^+$ source region 27 and a p+drain region 25. These source and drain regions 27, 25 extend deeper in the substrate 1 than the previously doped regions 18. The side spacers 23 act as a mask to protect portions of the previously doped regions 18 from this latter p$^+$ implant 29. Thus, extension regions 18 remain after this action.

As is known to a person skilled in the art, the manufacture of the MOS device is completed by, e.g., providing a suitable silicide process to form silicide on the drain 25, the source 27 and the polysilicon layer 13, which acts as a gate. This latter silicide process is known to a person skilled in the art and not shown in FIG. 1f.

The invention claimed is:
1. Method of producing a semiconductor device comprising:
   a) providing a semiconductor substrate,
   b) providing an insulating layer on a top surface of the semiconductor substrate,
   c) making an amorphous layer on a top layer of said semiconductor substrate by a suitable implant
   d) implanting a dopant into said semiconductor substrate through said insulating layer to provide said amorphous layer with a predetermined doping profile,
   e) applying a solid phase epitaxial regrowth action to regrow said amorphous layer and activate said dopant, wherein in action d), said implant is performed such that said doping profile has a peak value located within said insulating layer.

2. Method according to claim 1, wherein said dopant is activated to provide said amorphous layer after action e) with a conductivity profile having a peak conductivity value located substantially at said top surface.

3. Method according to claim 1, wherein said semiconductor substrate is a Si substrate and action c) is performed with at least one of Ge, $GeF_2$, Si, Xe, or Ar atoms.

4. Method according to claim 3, wherein said action c) is performed with Ge in a dose of $10^{15}$ atoms/cm$^2$ and an energy between 2 and 30 keV.

5. Method according to claim 1, wherein said action d) is performed with B at an energy of less than 5 keV.

6. Method according to claim 5, wherein said action d) is perfomed with B and a dose of $10^{15}$ atoms/cm$^2$.

7. Method according to claim 6, wherein said action d) is performed at a temperature of 550-700° C. during about 1 minute.

* * * * *